United States Patent [19]
Narayanan et al.

[11] Patent Number: 5,648,912
[45] Date of Patent: Jul. 15, 1997

[54] INTERCONNECTION RESOURCE ASSIGNMENT METHOD FOR DIFFERENTIAL CURRENT SWITCH NETS

[75] Inventors: Vinod Narayanan, Fishkill; Philip S. Honsinger, Poughkeepsie, both of N.Y.; Lok Tin Liu, Berkeley, Calif.

[73] Assignee: International Business Machines Corporation, Armonk, N.Y.

[21] Appl. No.: 44,872

[22] Filed: Apr. 12, 1993

[51] Int. Cl.$^6$ .................................................. G06F 17/50
[52] U.S. Cl. ........................ 364/491; 364/489; 364/490
[58] Field of Search ..................... 864/488, 489, 864/490, 491, 578

[56] References Cited

U.S. PATENT DOCUMENTS

| | | | |
|---|---|---|---|
| 4,577,276 | 3/1986 | Dunlop et al. | 364/491 |
| 4,593,363 | 6/1986 | Burstein et al. | 364/491 |
| 4,607,339 | 8/1986 | Davis | 364/491 |
| 4,608,649 | 8/1986 | Davis et al. | 364/491 |
| 4,615,001 | 9/1986 | Hudgins, Jr. | 364/200 |
| 4,636,965 | 1/1987 | Smith et al. | 364/491 |
| 4,742,471 | 5/1988 | Yoffa et al. | 364/491 |
| 4,777,606 | 10/1988 | Fournier | 364/491 |
| 4,829,446 | 5/1989 | Draney | 364/488 |
| 4,839,821 | 6/1989 | Murakata | 364/491 |
| 4,852,015 | 7/1989 | Doyle, Jr. | 364/491 |
| 4,852,016 | 7/1989 | McGehee | 364/491 |
| 4,890,238 | 12/1989 | Klein et al. | 364/491 |
| 4,903,214 | 2/1990 | Hiwatashi | 364/491 |
| 4,908,772 | 3/1990 | Chi | 364/491 |
| 4,975,854 | 12/1990 | Yabe | 364/491 |
| 5,072,402 | 12/1991 | Ashtaputre et al. | 364/491 |
| 5,224,056 | 6/1993 | Chene et al. | 364/490 |
| 5,237,514 | 8/1993 | Curtin | 364/488 |
| 5,272,645 | 12/1993 | Kawakami et al. | 364/488 |
| 5,397,749 | 3/1995 | Igarashi | 437/250 |
| 5,457,410 | 10/1995 | Ting | 326/41 |

OTHER PUBLICATIONS

Yao et al., "A New Approach to the Pin Assignment Problem", IEEE Trans. on CAD, vol. 8, No. 9, pp. 990–1006, 1989.

Marek–Sadowska et al., "Pin Assignment for Improved Performance in Standard Cell Design", IEEE, pp. 339–342, 1990.

Pedram et al., "Floorplanning with Pin Assignment," IEEE, 1990, pp. 98–101.

Jingsheng Cong, "Pin Assignment with Global Routing", IEEE, 1989, pp. 302–305.

Jingsheng Cong "Pin Assignment with Global Routing" 1989 Urbana, IL.

Massoud Pedram et al. "Floorplanning with Pin Assignment" 1990 Berkeley, CA.

E.B. Eichelberger et al. "Differential Current Switch—High performance at low power" *IBM Journal of Research and Development* pp. 313–319, vol. 35, No. 3 May 1991.

*Primary Examiner*—Kevin J. Teska
*Assistant Examiner*—Thai Phan
*Attorney, Agent, or Firm*—DeLio & Peterson, LLC; Peter W. Peterson; Aziz M. Ahsan

[57] ABSTRACT

A method for assigning interconnection resources to input/output connection points on differential current switch logic elements which need to use the resources, but which introduce an order dependency to the assignment problem, due to restrictions unique to differential current logic. The input/output connection points are paired first as are the interconnection resources. Pairing removes the order dependency. An assignment is then made through the use of an optimizing linear assignment algorithm suitable for single input/output connection point to single interconnection resource assignments. Preferably, a cost matrix is generated to determine the optimum assignment by minimizing the total assignment cost. The paired assignments are then broken apart to assign each individual member of the point pair to an individual member of the assigned resource pair. The final assignment of the individual pair members is compared to legality constraints, the violation of which may have been masked in the calculation of assignment costs of the pairs.

19 Claims, 3 Drawing Sheets

Maximal Matching, Cost = 17

INTERCONNECTION RESOURCE ASSIGNMENT METHOD FOR DIFFERENTIAL CURRENT SWITCH NETS

BACKGROUND OF THE INVENTION

1. Field of the Invention

This invention relates to the automated design of computer packages, and in particular to a method of optimally using limited interconnection resources, such as hybrid interconnection pins or wiring tracks on the computer package, to make connections to inputs and outputs on differential current switch logic elements.

2. Description of Related Art

The design of integrated computer packages in which multiple logic inputs and outputs must be interconnected has been greatly simplified through the use of automated design tools embodied in software. Such tools enable the designer to optimally use limited interconnection resources to make necessary connections. The interconnection resources may be wiring pins, vias, wiring tracks or other interconnection resources that are limited in number or by physical or design restrictions. The function of such software design tools is to determine a way of assigning the limited resources to respective requirements so as to globally optimize their use.

Examples of previous automated design tools include pin assignment programs and routing programs. Pin assignment programs assign connection points to destinations by matching input output connection points on logic chips to a specific one of many different interconnection pins that they might use. Routing programs assign routing paths to requirements that points and destinations be interconnected by selecting a specific one of many different possible wiring tracks that lead from a point to a destination. Such tools, however, were developed for use with conventional logic families such as emitter coupled logic (ECL), transistor logic (TTL) and the like. These logic families share certain similarities because the fundamental binary switch that each logic element is constructed from has a single electrical input and a single electrical output.

For example, ECL logic, which is widely used in high performance computer packages, has a pair of transistors forming its fundamental binary logic switch which steer current in one of two directions to give the two binary states of the switch. The base of one o the transistors is connected to a reference voltage and the input to the switch is connected to the base of the other transistor. When the voltage at the input is above the reference voltage, the current is steered in one direction, and when it is below the reference voltage, it is steered in the other.

The desire for fast, low power logic circuitry has led to the development of a low power variation of emitter coupled logic called differential current switch (DCS). The DCS logic family uses differential signal pairs to represent logic signals and requires two inputs for each basic logic switch. The DCS logic switch is similar to the ECL logic switch in that it uses a pair of transistors that steer current in one of two directions to define the binary state of the switch. However, it has two inputs to each logic gate, connected to the bases of the two transistors.

To change the state of the DCS logic element, one of the inputs is driven high and the other is simultaneously driven low. The advantage to using twin inputs carrying complementary signals is that the DCS signal swing can be reduced to less than 50% of the ECL signal swing while retaining the same reliable switching as the ECL logic family. This provides improved speed and decreased power consumption at the cost of increasing circuit complexity by doubling the number of wires and interconnection points for each logic gate.

In some designs this complexity is acceptable, as it results in improved performance and reduced power dissipation. This is particularly desirable in high-speed computers that are air cooled. However, present automated design tools are not well suited to designing computer packages that use DCS logic because the dual input/dual output logic introduces complexities not found in single input/single output logic families.

Since both a signal and its complementary phase must be carried in DCS logic, all interconnections are carried between the gates on two separate paths called "rails". The interconnections between the logic elements on the rails are generally referred to as a "DCS net". In the design of a DCS net, to insure reliable switching, the following conditions have to be satisfied for the two signals to maintain their relative phases and magnitudes when they arrive at the receiver:

1. The electrical length of both rails should be the same; and
2. Each rail should be exposed to the same electrical environment, such as noise effects.

In most practical designs, these requirements translate into the following restrictions:

1. The two rails should have the same length within a certain tolerance; and
2. The two rails should be routed next to each other as far as possible.

These design limitations are distinctly different from the limitations that apply when designing a computer package for use with logic families that include only a single input. In the design of computer packages using single input/single output logic families, the assignment of an interconnection resource, such as an available interconnection pin or wiring track, to an input or output on a logic chip is assumed to be relatively independent of the assignments of the other resources. Thus, assignments can be calculated individually for each requirement in any order to achieve a globally optimum solution for use of the resources.

In the automated design of a computer package containing DCS logic, however, the limitations above introduce an order dependence into the problem. Conventional automated design tools may find an optimal path for one of the two rails, but the second rail must then be routed in accordance with the above strict requirements. This often results in a nonoptimal assignment globally.

The present invention provides a method for using preexisting automated design tools and algorithms developed for single input/output logic families to optimally assign interconnection resources (interconnection pins and available wiring tracks) to the dual input/output connection points on DCS logic chips.

While the invention may be used in connection with the automated design of any package incorporating logic using complementary or paired signals, it is particularly described in connection with DCS logic when used in the manufacture of thermal conducting modules (TCMs) in large mainframe computers where the interconnection assignment task is particularly complex and the optimal use of limited interconnection resources is particularly important.

Thermal conducting modules are a type of multi-chip carrier used in high performance computers in which multiple logic chips are integrated into a single package.

Originally, TCMs were designed with only one type of wiring media. However, they are now being designed with two types of wiring media, thin film and glass ceramic. A certain number of wiring layers are constructed with thin film and the others with glass ceramic. The logic chips are located at the uppermost layer on top of one or more thin film wiring layers which make connection to the logic chips. Below the thin film layers are one or more glass ceramic wiring layers.

The thin film layers make contact to the inputs and outputs (generically referred to herein as input/output connection points) on the DCS chips. A wire formed on the thin film layer runs horizontally from this connection point to an interconnection pin. The pin penetrates vertically down through the thin film layers to the appropriate glass ceramic layer. Another wire formed on the glass ceramic layer runs across the layer to a second interconnection pin which brings the signal up to another thin film layer and from there to its destination.

The glass ceramic layers are mounted to a substrate which may be air or liquid cooled. TCMs are usually designed with regular grids for the wiring and pins. The pin grid on the thin film layer, however, is much finer than the pin grid on the glass ceramic layer. Typically, the grid pitch on the glass ceramic is twice that on the thin film. Hence, there are only a small number of interconnection pins, referred to as "hybrid pins", which connect the two media.

All connections being wired in glass ceramic have to use a hybrid pin to get down to the glass ceramic layers from the top surface. Since a large amount of the wiring is typically done in glass ceramic, quite a few connections need to use these hybrid pins. There are also other uses for the pins such as bringing power to the chips. Accordingly the hybrid pins are a very scarce resource which must be used in an optimal fashion. If the assignment is not optimal, some pins may end up being unusable because they will be too far from or too close to an input/output connection point that needs to use them, or otherwise fail to meet some limitation on their use that might have been satisfied if a better assignment method had been used.

Conventional automated design tools fail to achieve the desired optimization when assigning interconnection resources for use by DCS nets because of the order dependence introduced by the paired wiring of DCS logic. Typical pin assignment and routing algorithms work on a one-connection-at-a-time basis. The pin assigned or the available wiring track selected is decided during the routing process for each connection. If that methodology is followed in a DCS chip design, however, the hybrid pin used by each connection to enter the glass ceramic layer will be determined as it is routed.

This approach leads to a globally non-optimal solution, even though an optimal solution may be found for a particular connection. Also, no consideration can be given to the relative difficulty of the constraints on different connections, except by the order in which they are routed.

In addition to providing a method of using existing automated design tools to achieve globally optimal solutions for interconnection resource assignment, the present invention is directed to a simplified method for DCS wiring which breaks the design problem into a first stage in which the DCS input/output connection points are assigned to the scarce resource hybrid pins, and a second step in which routing of wiring tracks occurs.

The task of optimally using interconnection resources to make connections on a TCM between the output of a logic gate on one DCS chip and the input to a logic gate on another DCS chip involves a series of paired decisions as to how to use resources subject to certain requirements. Four hybrid pins need to be assigned, two to the paired outputs of the first logic gate and two to the paired inputs of the second gate. Four wiring tracks on the thin film layer need to be assigned, two from the paired inputs to their assigned pins, and two from the paired outputs to their pins. Finally, a pair of wiring tracks on the ceramic wiring layer need to be assigned, from the pins assigned to the inputs to the pins assigned to the outputs.

In each case there are certain limitations on the assignments. One set of limitations is due to physical constraints that apply regardless of the fact that a DCS pair is being assigned. These are limitations such as minimum and maximum distances from a connection point to its assigned hybrid pin. These limitations apply in the assignment of resources in the design of a TCM based on conventional logic families, as well as in DCS designs. Conventional design tools handle these limitations well.

The other limitations are due to the DCS restrictions that the rails be of equal length and routed closely together. Previous design tools do not perform well in making assignments subject to these types of restrictions. The present invention, however, provides a method of adapting prior art design tools developed for single I/O logic families for use in DCS logic design tasks.

Bearing in mind the problems and deficiencies in the prior art, it is therefore an object of the present invention to provide a method of automated design of computer packages incorporating differential current switch logic elements.

It is another object of the present invention to provide a method of automated design which adapts previous methods of routing and pin assignment algorithms and procedures developed for single I/O logic families for use with DCS paired I/O logic.

It is still another object of the present invention to provide a method of optimally assigning hybrid pins to DCS input/output connection points.

SUMMARY OF THE INVENTION

The above and other objects which will be apparent to those skilled in the art are achieved in the present invention which comprises a method of assigning interconnection resources to input/output connection points on differential current switch logic elements. The method comprises identifying input/output connection points requiring interconnection, pairing the identified points, representing the paired points as single points, identifying available resources, pairing the identified resources and representing the paired resources as a single resource. These initial steps prepare the problem in a way that removes order dependencies. Thus, in the next step an assignment algorithm can be used which achieves a globally optimum solution when used for non-order dependent assignment problems such as are found in the design of conventional single input/output logic families.

Once the paired connection points have been assigned with such an algorithm to its corresponding paired resource, the pairs are broken apart and each individual member of the pair is assigned to a corresponding member of its assigned pair. This final assignment also includes a check on any legality constraints, the violation of which may have been masked during the assignment in pairs.

The method may be used for the assignment of interconnection pins to DCS input/outputs or for the assignment of wiring tracks between DCS inputs/outputs and a destination. The destination may be an interconnection pin assigned by the method in a previous step. The preferred method for assigning input/output connection points to interconnection pins is to construct a cost matrix in which the cost is calculated for assigning each of the available resources to each of the input/output connection points needing to use a resource. The hungarian linear assignment algorithm is the preferred method for computing the assignments which minimizes the total assignment cost. The invention may be applied to the assignment of pin pairs or to the assignment of wiring tracks between an input/output and a destination.

DESCRIPTION OF THE PREFERRED EMBODIMENT(S)

Figure 1:
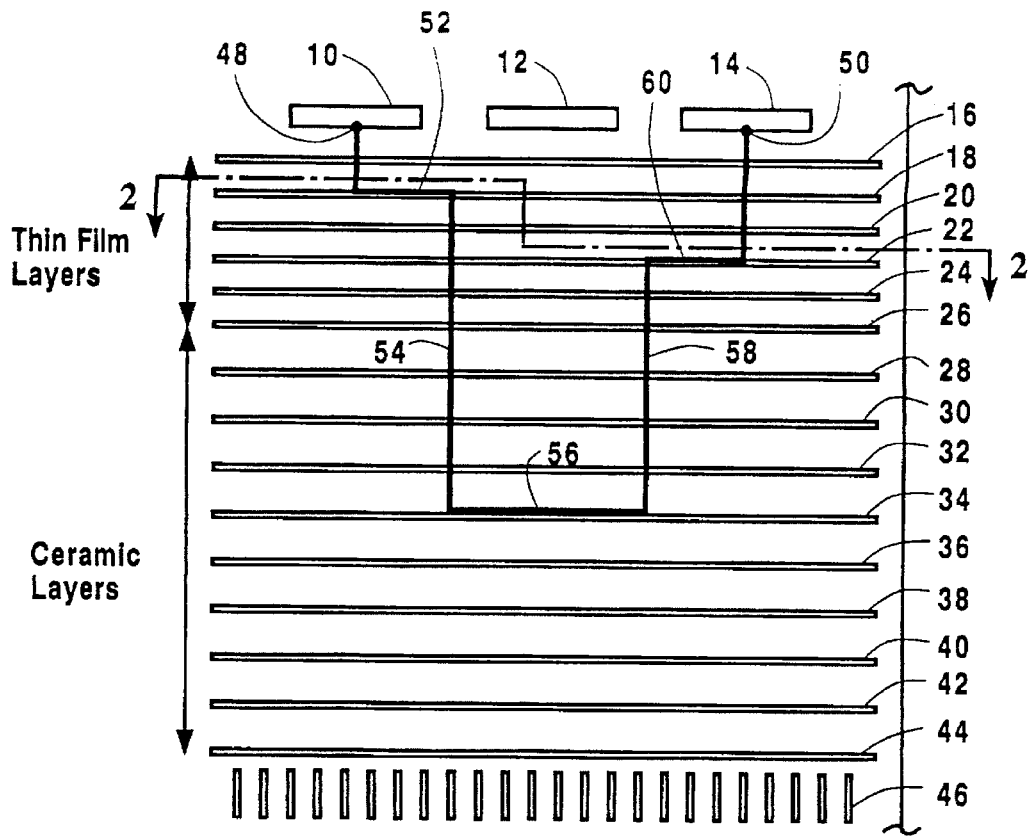
FIG. 1 is a side elevational view of a thermal conducting module with wiring connecting two DCS logic chips through multiple thin film and ceramic glass layers.

Referring to FIG. 1, a side view of a thermal conducting module (TCM) is shown in which multiple DCS logic chips 10, 12, 14 are interconnected through thin film layers 16–26 and glass ceramic layers 28–42. The glass ceramic layers are mounted on a substrate 44 which includes fins 46 exposed to the flow of air or another heat transfer fluid.

Figure 2:
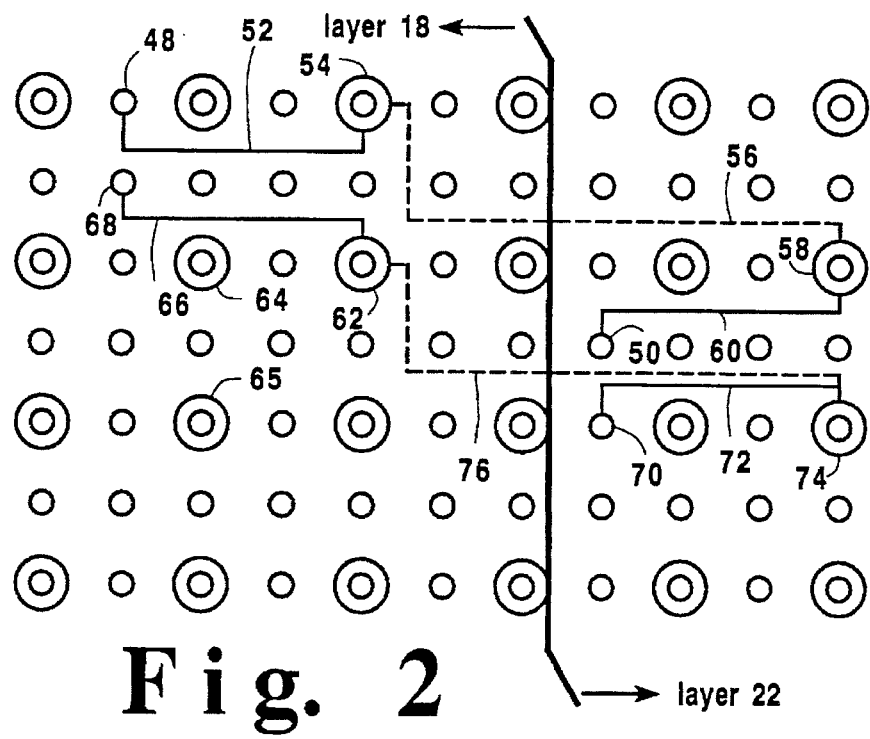
FIG. 2 is a top view of a portion of the connection point layout of the thin film and ceramic glass layers on the thermal conducting module.

Referring also to FIG. 2, logic chip 10 includes a pair of output connection points 48, 68 which must be connected to a corresponding pair of input connection points 50, 70 on logic chip 14. In the side view of FIG. 1 only one member of each pair of connection points, hybrid pins or wires is shown. This is partly to make the drawing easy to read, but also for use in describing the method of the invention in which paired entities are treated as single elements so that automated design tools developed for use with single input/output logic families may be used for DCS design.

FIG. 2 illustrates a portion of thin film layers 18 and 22 in the vicinity of connection points 48, 50, 68, 70 including a grid of thin film connection points (small circles) and a grid of hybrid pins (large circles). Logic chips 10 and 14 are connected through wiring on ceramic layer 34. To reach this layer, one of the hybrid pins must be used, but the connection to the chips must be made by the thin film layer.

The interconnection from outputs 48, 68 to inputs 50, 70 is achieved partly by wiring on the thin film layers and partly by wiring on a ceramic layer. Wires 52, 66 on thin film layer 18 extend from connection points 48, 68 to hybrid pins 54, 62. The hybrid pins bring the signal down to ceramic layer 34. Wires 56, 76 formed on the ceramic layer carry the signal to hybrid pins 58, 74 and from there back up to thin film layer 22 where wires 60, 72 bring the signal over to connection points 50, 70.

Restrictions exist on the minimum and maximum distance between a connection point and a hybrid pin that is to be assigned to it. However, there are many different hybrid pins, such as pins 64 and 65, that meet these restrictions and which could have been used to make the connection to ceramic layer 34.

Connection points 48 and 68 form a DCS output pair located on chip 10 which need to be connected to corresponding points on chip 14. Limitations exist, however, on the length of the connecting wires 52 and 66 in the thin film. Also, the wires 52 and 66 in the thin film layer must be located as close as possible together and be of the same electrical length to meet the requirements for DCS net circuitry. Tools exist to optimize the assignment between connection point 48 and one of the hybrid pins on the TCM. However if this assignment is made without due consideration to the requirements of the companion DCS input/output connection 68, a less than optimum assignment for the entire problem will be reached.

Accordingly, the present invention comprises the steps of:

(a) identifying all differential current switch input/output connection points requiring interconnection;

(b) pairing the identified differential current switch input/output connection points;

(c) representing the paired differential current switch input/output connection points as a single point;

(d) identifying available interconnection resources;

(e) pairing the identified interconnection resources;

(f) representing the paired interconnection resources as a single resource;

(g) assigning each input/output connection point representing a point pair to a corresponding interconnection resource representing a resource pair according to an optimizing assignment algorithm suitable for single input/output connection point to single interconnection resource assignments; and (h) assigning each individual interconnection resource in a pair to a specific one of the input/output connection points in the corresponding assigned point pair.

With the method of the invention, paired resources (which may be a pair of hybrid pins or wiring tracks) and paired requirements for the DCS circuitry are treated as single resources and single requirements before the assignment is undertaken. This removes the order dependence from the problem introduced by the specific requirements of DCS circuitry. It permits assignment methods and automated design tools, intended for use with single input/output logic families, to be used in DCS circuit design to achieve a globally optimal solution for using limited interconnection resources.

The preferred method of assigning the input/output connection points to the interconnection resources comprises computing a single cost for assigning each input/output connection point pair to each of the other potential interconnection pin pairs. This method, as applied to the assignment of pins to chip inputs and outputs includes the steps of:

(a) identifying all differential current switch input/output connection points requiring interconnection pins;

(b) pairing the identified differential current switch input/output connection points;

(c) representing the paired differential current switch input/output connection points as a single point;

(d) identifying suitable interconnection pins;

(e) pairing the identified interconnection pins;

(f) representing the paired interconnection pins as a single pin;

(g) computing a cost for assigning each input/output connection point pair to each interconnection pin pair;

(h) constructing a two dimensional pin to point cost matrix;

(i) assigning each input/output connection point representing a point pair to a corresponding interconnection pin representing a pin pair by using the hungarian algorithm for linear assignment on the cost matrix to minimize the total assignment cost; and (j) assigning each interconnection pin in a pin pair to one of the input/output connection points in the corresponding assigned point pair such that predetermined legality constraints are satisfied.

Figure 5:
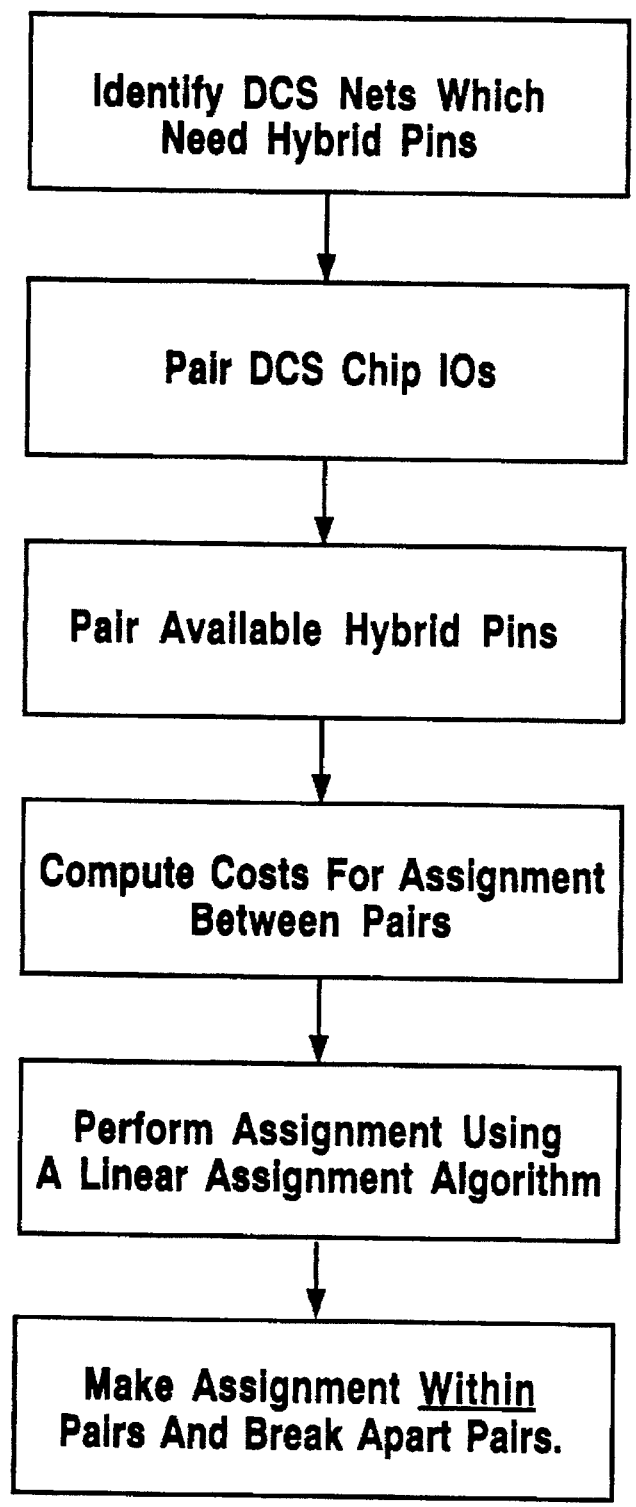
FIG. 5 is a flow chart of the preferred embodiment of the method.

A summary of this method in flow chart form is shown in FIG. 5. In order to generate a cost for each assignment, the following factors are typically considered:

1. the distance from the chip input/output connection point to the hybrid pin;
2. the direction that the connection has to exit the chip input/output connection point, based on performing a global route on the connection;
3. the maximum and minimum length limits on the thin film part of the connection; and
4. the eventual depth of the hybrid pin as determined by global routing.

In addition, the minimum and maximum thin film length limits may be used to filter candidate hybrid pins. Any hybrid pin which is not within the limitations may be assigned a cost of infinity (or at least a cost that it is high enough to preclude assignment to the particular hybrid pin pair).

By proceeding in this way, a cost matrix is generated in which rows correspond to resources and columns correspond to requirements. The matrix elements are the cost of assigning the particular resource in that row to the particular requirement in that column.

Once the cost matrix has been generated, a linear assignment algorithm may be used to determine the optimal assignment that minimizes the sum of the assignment costs. The hungarian algorithm for linear assignment is the preferred method which processes the cost matrix and generates the globally optimal assignment.

Figure 3A:
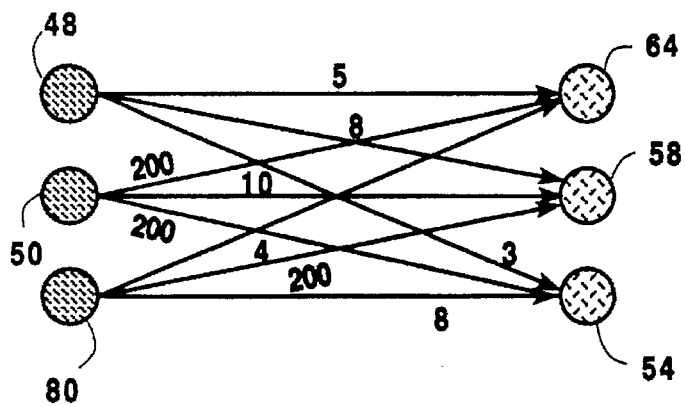
FIGS. 3a and 3b show assignment costs and an optimum assignment for a simplified assignment task.
Figure 3B:
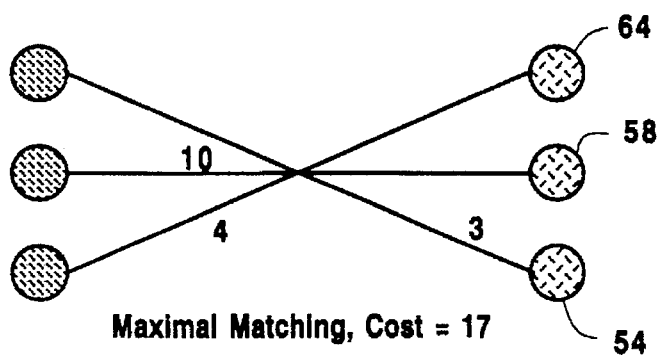
Figure 4:
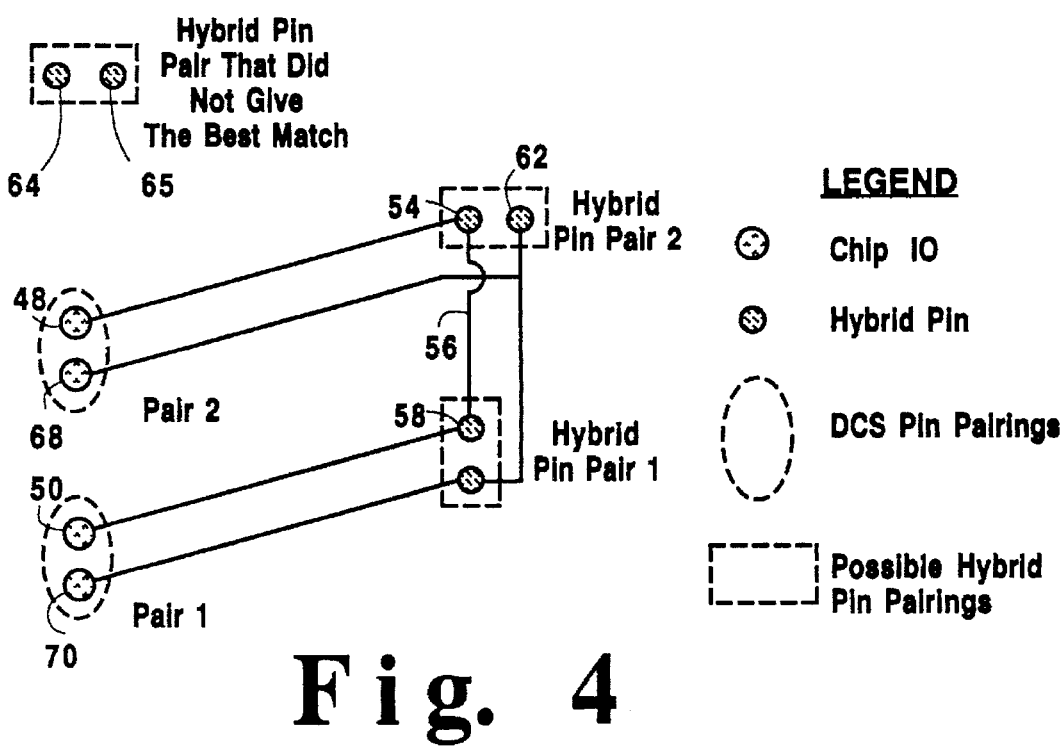
FIG. 4 shows a physical model for selecting the best match between connection points and interconnection resources.

FIGS. 3a and 3b illustrate a simplified form of the processing involved. A pair of output connection points 48, 68 from FIG. 2 are identified (step a, above), paired with one another (step b), and represented as a single point 48 (step c). Other input/output connection points that need to use hybrid pins are point pair 50, 70 (represented as single point 50), and for purposes of explanation, a third point pair 80.

Because each point pair 48, 50, 80 needs to use hybrid pins to get down to the ceramic layer, pairs of hybrid pins that might be used are identified (step d), paired (step e) and represented as a single resource (step f). Referring to FIGS. 2 and 3, some of the potential hybrid pin pairs that might be used are pairs 54, 62; pair 64, 65 and pair 58, 74 represented as single points 54, 58 and 64.

The costs associated with each possible assignment are shown by the labeled arrows in FIG. 3a. The cost for assigning point pair 48 to hybrid pin pair 54 is 3. The cost for assigning point pair 48 to hybrid pin pair 58 is 8 and the cost for assigning it to hybrid pin pair 64 is 5. The costs for assigning point pair 50 to each of the three pin pairs is also shown. Note that high costs (cost=200) are shown for the pre-assignment to pin pairs 54 and 64. This illustrates how these assignments can be prohibited by assigning appropriate costs, sufficiently high to preclude assignment. A globally optimum solution is achieved when the sum of the assignment costs is minimized as illustrated in FIG. 3b.

Because point pairs are being used instead of individual points, an average length is used in the determination of the assignment cost. The length costs may be calculated by determining the average of the distance from a first connection point of the point pair to a first pin of the pin pair and averaging that with the distance from the second connection point of the point pair to the second pin of the pin pair.

The assignment of paired resources to paired requirements corresponds to step (g) above. After a paired requirement is matched to a paired resource, however, a further step remains (step h) in which the pairs are broken apart. In this step each member of a pair resources is assigned to a specific one of the members in its assigned pair of requirements. Specifically, when matching input/output connection points to hybrid pins, one of the connection points in the pair must be specifically assigned to one of the hybrid pins before the routing step can be undertaken.

Simply because the average distance meets the relevant legality constraints on distances in the thin film layer does not guarantee that the individual distances will meet those constraints when the pairs are broken apart. Accordingly, in step (h) above, before assignment of the individual connection points to the specific hybrid pins is performed, the legality constraints on the assignment are checked again.

In performing step (h) wherein the paired requirements and resources are broken apart, one of the legality constraints is the length in the thin film layer as described above. Another constraint is the specific DCS differential length constraint. When the hybrid interconnection pair is being broken apart and assigned to specific input/output connection points in its assigned point pair, a first input/output connection point in the point pair is assigned to a first hybrid pin to define a first pin to point distance. The second interconnection pin in the pin pair is then assigned to the second input/output connection point to define a second pin to point distance. The specific assignment is made such that the difference between the first pin to point distance and the second pin to point distance is less than a predetermined limit set by the allowable differential length in the DCS rail.

The invention has been described principally in terms of assigning hybrid pins to inputs and outputs on DCS logic chips. The hybrid pins, however, are only one portion of the connection path between an output on one chip and an input on another. By breaking the problem down into separate stages involving first assigning hybrid pins to connection points and then performing routing between the connection points and the hybrid pins or between one hybrid pin and another hybrid pin, the problem is simplified.

Conventional routing methods may be used to select the wiring tracks. However, for the reasons given above, this is difficult in view of the order dependence of the problem introduced by the requirements of DCS rails to be close together and of the same length. The solution is to use the method of the invention to assign pairs of wiring tracks. The pairs of wiring tracks comprise the interconnection resources of the method.

In this application of the method, first and second wiring tracks are paired and treated as a single resource. Pairing is performed subject to a first legality requirement that the length of the first wiring track differs from the length of the second wiring track by no more than a predetermined amount and a second legality requirement that each point along the length of the first wiring track is within a predetermined distance from each point along the second wiring track.

Thus, having described the invention, what is claimed is:

1. An interconnection resource assignment method for assigning interconnection resources to input/output connection points on differential current switch logic elements comprising the steps of:

(a) identifying all differential current switch input/output connection points requiring interconnection;

(b) pairing the identified differential current switch input/output connection points;

(c) representing the paired differential current switch input/output connection points as a single point;

(d) identifying available interconnection resources;

(e) pairing the identified interconnection resources by pairing a first interconnection resource with a second interconnection resource located within a predetermined distance from the first interconnection resource, and then repeating the same pairing procedure until each interconnection resource has been paired with another interconnection resource;

(f) representing the paired interconnection resources as a single resource;

(g) assigning each input/output connection point representing a point pair to a corresponding interconnection resource representing a resource pair according to an optimizing assignment algorithm suitable for single input/output connection point to single interconnection resource assignments; and (h) assigning each individual interconnection resource in a pair to a specific one of the input/output connection points in the corresponding assigned point pair.

2. An interconnection resource assignment method according to claim 1 wherein the interconnection resources comprise interconnection pins for connecting the differential current switch logic elements to a wiring layer.

3. An interconnection resource assignment method according to claim 2 wherein step (g) comprises computing a single cost for assigning each input/output connection point pair to each potential interconnection pin pair and then using a linear assignment algorithm to assign input/output connection point pairs to corresponding interconnection pin pairs to minimize the sum of the assignment costs.

4. An interconnection resource assignment method according to claim 3 wherein the assignment cost includes a factor corresponding to a calculated distance from the input/output connection point pair to the interconnection pin pair.

5. An interconnection resource assignment method according to claim 4 wherein the distance from the input/output connection point pair to the interconnection pin pair is calculated as the average of the distance from a first connection point of the point pair to a first pin of the pin pair and the distance from a second connection point of the point pair to a second pin of the pin pair.

6. An interconnection resource assignment method according to claim 4 wherein the assignment cost is set high enough to preclude assignment whenever the distance from the input/output connection point pair to the interconnection pin pair is greater than a predetermined maximum distance or less than a predetermined minimum distance.

7. An interconnection resource assignment method according to claim 2 wherein step (h) comprises assigning each individual interconnection pin in a pair to a specific one of the input/output connection points in the corresponding assigned point pair such that predetermined legality constraints are met.

8. An interconnection resource assignment method according to claim 7 wherein step (h) comprises assigning a first interconnection pin in a pin pair to a first input/output connection point in the corresponding assigned point pair, thereby defining a first pin to point distance, and assigning a second interconnection pin in the pin pair to a second input/output connection point in the corresponding assigned point pair, thereby defining a second pin to point distance, the assignment being made such that the difference between the first pin to point distance and the second pin to point distance is less than a predetermined limit.

9. An interconnection resource assignment method according to claim 1 wherein the differential current switch logic elements are located on a chip on a thin film layer overlying a ceramic wiring layer, and the interconnection resources comprise hybrid interconnection pins extending from the ceramic wiring layer to the thin film layer.

10. An interconnection resource assignment method according to claim 9 wherein step (g) comprises computing a single cost for assigning each input/output connection point pair to each potential interconnection pin pair and then using a linear assignment algorithm to assign input/output connection point pairs to corresponding interconnection pin pairs to minimize the sum of the assignment costs.

11. An interconnection resource assignment method according to claim 10 wherein the assignment cost includes a factor corresponding to a calculated distance on the thin film layer from the input/output connection point pair to the interconnection pin pair.

12. An interconnection resource assignment method according to claim 11 wherein the assignment cost is set high enough to preclude assignment whenever the distance on the thin film layer from the input/output connection point pair to the interconnection pin pair is greater than a predetermined maximum distance or less than a predetermined minimum distance.

13. An interconnection resource assignment method according to claim 10 wherein the thin film layer overlies a plurality of ceramic wiring layers and the assignment cost includes a factor corresponding to the depth of the hybrid pin required to reach a desired wiring layer.

14. An interconnection resource assignment method according to claim 1 wherein the interconnection resources comprise wiring tracks suitable for differential current switch wiring.

15. An interconnection resource assignment method according to claim 14 wherein step (e) comprises pairing a first wiring track with a second wiring track having a length that differs from the first wiring track by no more than a predetermined amount, and then repeating the pairing until all wiring tracks have been paired.

16. An interconnection resource assignment method according to claim 14 wherein step (e) comprises pairing a first wiring track with a second wiring track located within a predetermined distance from the first wiring track at each point along its length, and then repeating the pairing until all wiring tracks have been paired.

17. An interconnection resource assignment method according to claim 14 wherein step (g) comprises assigning each input/output connection point representing a point pair to a corresponding wiring track representing a wiring track pair according to a routing algorithm.

18. An interconnection resource assignment method for assigning interconnection pins to input/output connection points on differential current switch logic elements comprising the steps of:

(a) identifying all differential current switch input/output connection points requiring interconnection pins;

(b) pairing the identified differential current switch input/output connection points;

(c) representing the paired differential current switch input/output connection points as a single point;

(d) identifying suitable interconnection pins;

(e) pairing the identified interconnection pins;

(f) representing the paired interconnection pins as a single pin;

(g) computing a cost for assigning each input/output connection point pair to each interconnection pin pair;

(h) constructing a two dimensional pin to point cost matrix;

(i) assigning each input/output connection point representing a point pair to a corresponding interconnection pin representing a pin pair by using the hungarian algorithm for linear assignment on the cost matrix to minimize the total assignment cost; and (j) assigning each interconnection pin in a pin pair to one of the input/output connection points in the corresponding assigned point pair such that predetermined legality constraints are satisfied.

19. An interconnection resource assignment method for assigning interconnection resources, composed of interconnection pins and wiring tracks, to input/output connection points on differential current switch logic elements comprising the steps of:

(a) first assigning interconnection pins to input/output connection points on differential current switch logic elements by performing the steps of:

(i) identifying differential current switch input/output connection points requiring interconnection;

(ii) pairing the identified differential current switch input/output connection points;

(iii) representing the paired differential current switch input/output connection points as a single point;

(iv) identifying available interconnection pins;

(v) pairing the identified interconnection pins;

(vi) representing the paired interconnection pins as a single pin;

(vii) assigning each input/output connection point representing a point pair to a corresponding interconnection pin representing a pin pair according to an optimizing assignment algorithm suitable for single input/output connection point to single interconnection pin assignments; and (b) after assigning all input/output connection point pairs to interconnection pin pairs, assigning a pair of wiring tracks from each point pair to its assigned pin pair.

* * * * *